United States Patent
Humphrey et al.

(10) Patent No.: US 6,489,820 B1
(45) Date of Patent: Dec. 3, 2002

(54) METHOD AND APPARATUS FOR DISTRIBUTING CLOCKS

(75) Inventors: Guy Harlan Humphrey, Fort Collins, CO (US); David Lawrence Linam, Fort Collins, CO (US); Richard Alan Krzyzkowski, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/965,754

(22) Filed: Sep. 28, 2001

(51) Int. Cl.$^7$ ................................................ H03L 7/06
(52) U.S. Cl. ......................... 327/146; 327/158; 327/161
(58) Field of Search ............................... 327/144–150, 327/155, 158, 161–163; 375/375, 376

(56) References Cited

U.S. PATENT DOCUMENTS 5,216,302 A * 6/1993 Tanizawa ..................... 331/1 A

* cited by examiner

Primary Examiner—Kenneth B. Wells

(57) ABSTRACT

Insertion delay associated with receiving and distributing a clock within an IC is removed using a DLL. The structure of a differential receiver in the feedback circuit of the DLL is substantially matched to the structure of an input differential receiver which receives and inputs a differential input clock into the DLL. In this manner, the insertion delay associated with the input differential receiver is removed from a delay-corrected clock output from the DLL. By substantially matching one or more aspects of the feedback circuit to one or more aspects of a clock distribution circuit for distributing the delay-corrected clock, the insertion delay associated with the clock distribution circuit can also be removed from the delay-corrected clock.

24 Claims, 8 Drawing Sheets

METHOD AND APPARATUS FOR DISTRIBUTING CLOCKS

FIELD OF THE INVENTION

The invention pertains to clock distribution, particularly within an integrated circuit (IC).

BACKGROUND OF THE INVENTION

Most high speed integrated circuits (ICs) utilize some form of delay-locked loop (DLL) for the creation of internal clocks. A DLL removes the insertion delay from an IC's internal clocks so that the delays associated with clocks received at an IC's register elements match the delays associated with an external clock received at the IC's external contacts. Delays which can be matched include delays which affect phase alignment, and delays which affect frequency.

A DLL removes insertion delay using a delay comparator and correction unit. The delay comparator and correction unit receives first and second clocks, one of which is derived from an input clock, and one of which is derived from a feedback clock. In response to these clocks, the delay comparator and correction unit generates a delay-corrected clock and the afore-mentioned feedback clock. The delay-corrected clock is then distributed to an IC's register elements via a clock distribution network, and the feedback clock is routed back into the delay comparator and correction unit via a feedback circuit comprising a string of invertors. If the feedback circuit is constructed such that its delay equals the sum of 1) the delay incurred in routing a clock signal through the clock distribution circuit, 2) the delay incurred in receiving, buffering and inputting the input clock into the delay comparator and correction unit, and 3) the delay through the delay comparator and correction unit, then the delays associated with clocks received at the IC's register elements will substantially match the delays associated with the input clock.

SUMMARY OF THE INVENTION

A first preferred embodiment of apparatus for distributing clocks comprises first and second differential receivers, a delay comparator and correction unit, and a feedback circuit. The structures of the first and second differential receivers are substantially matched, with the first differential receiver receiving a differential input clock and outputting a first clock, and with the second differential receiver receiving a differential feedback clock and outputting a second clock. The first and second clocks are received by the delay comparator and correction unit, and in response thereto, the delay comparator and correction unit generates a delay-corrected clock and a feedback clock. The feedback circuit comprises 1) a first signal route for carrying the feedback clock from the delay comparator and correction unit, 2) a converter for converting the feedback clock into the afore-mentioned differential feedback clock, and 3) a second signal route for coupling the converter to the second differential receiver.

A second preferred embodiment of apparatus for distributing clocks comprises first and second differential receivers, a delay comparator and correction unit, and a feedback circuit. The structures of the first and second differential receivers are substantially matched, with the first differential receiver receiving a differential input clock and outputting a first clock, and with the second differential receiver receiving a differential feedback clock and outputting a second clock. The first and second clocks are received by the delay comparator and correction unit, and in response thereto, the delay comparator and correction unit generates a differential delay-corrected clock and a differential feedback clock. The feedback circuit carries the differential feedback clock from the delay comparator and correction unit to the second differential receiver.

A first preferred embodiment of a method for distributing clocks commences with providing first and second differential receivers with substantially matched structures. A differential input clock is then received at the first differential receiver, and a differential feedback clock is received at the second differential receiver. Clocks which are output from the first and second differential receivers are then compared and, in response thereto, a delay-corrected clock and a feedback clock are generated. The feedback clock is then converted to the differential feedback clock.

A second preferred embodiment of a method for distributing clocks commences with providing first and second differential receivers with substantially matched structures. A differential input clock is then received at the first differential receiver, and a differential feedback clock is received at the second differential receiver. Clocks which are output from the first and second differential receivers are then compared and, in response thereto, a differential delay-corrected clock and the afore-mentioned differential feedback clock are generated.

The advantages of these and other embodiments of the invention will be further explained in, or will become apparent from, the accompanying description, drawings and claims.

BRIEF DESCRIPTION OF THE DRAWINGS

Illustrative and presently preferred embodiments of the invention are illustrated in the drawings, in which.

DESCRIPTION OF THE PREFERRED EMBODIMENT

Figure 1:
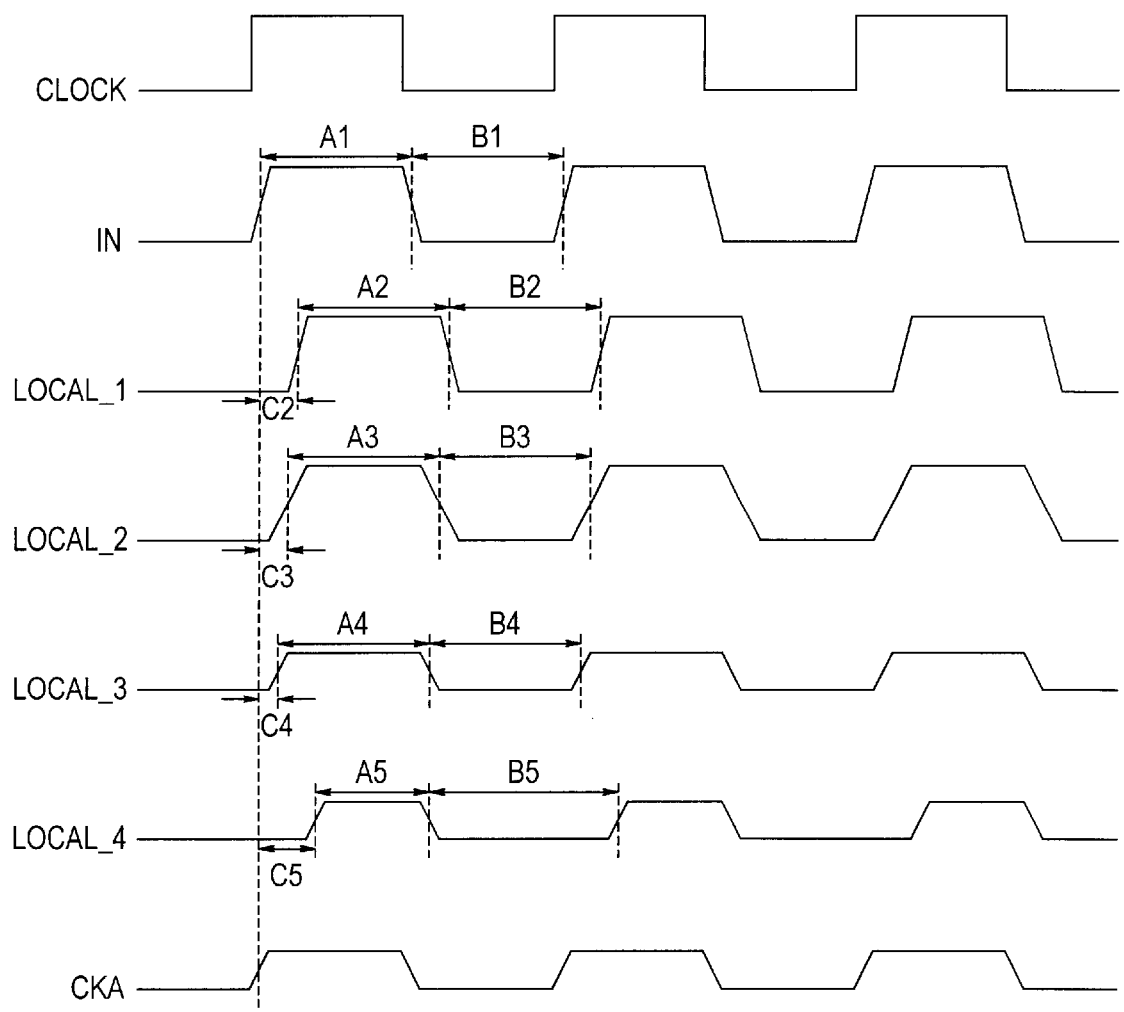
FIG. 1 illustrates delays between various clocks.

FIG. 1 illustrates delays between various clocks. The clocks are drawn in a representative fashion, and are not intended to portray real-world clocks. A clock, CLOCK, which is transmitted over a signal line may be subjected to edge degradations and propagation delays such that it appears as clock IN when it arrives at the contacts of an integrated circuit (IC). Note that clock IN comprises a high period, A1, and a low period, B1. When copies of clock IN are distributed to the register elements (e.g., latches or flip-flops) of an IC, the copies of clock IN received by the register elements may appear, for example, as any of clocks LOCAL_1, LOCAL_2, LOCAL_3 or LOCAL_4. Preferably, clock distribution circuits within an IC are well-matched so that the various local clocks which are received by an IC's register elements all appear as clock LOCAL_1, or all appear as clock LOCAL_2, etc. Thus, attempts to remove the insertion delays associated with these local clocks result in all local clocks being matched to the IC's input clock, IN. Insertion delays are those delays which result from an input clock being received into and distributed within an IC.

In FIG. 1, clock LOCAL_1 is associated with an insertion delay labeled C2. The delay C2 may be attributable to, for example, delays in propagating clock LOCAL_1 to an IC's register elements. Clock LOCAL_2 is associated with an insertion delay labeled C3. The delay C3 may be attributable to, for example, delays in propagating clock LOCAL_2 to an IC's register elements, as well as degradation in the edges of clock LOCAL_2 as it propagates to an IC's register elements. Clock LOCAL_3 is associated with an insertion delay labeled C4. The delay C4 may be attributable to, for example, delays in propagating clock LOCAL_3 to an IC's register elements, as well as the difference in voltage swings between clocks IN and LOCAL_3. Finally, clock LOCAL_4 is associated with an insertion delay labeled C5. The delay C5 may be attributable to, for example, delays in propagating clock LOCAL_4 to an IC's register elements, differences in voltage swings between clocks IN and LOCAL_4, and differences in the duty cycles of clocks IN and LOCAL_4. Other insertion delays may be associated with local clocks, and the above examples are merely illustrative of some of the potential insertion delays.

Typically, it is desirable to remove insertion delays from local clocks. Ideally, methods and apparatus for removing insertion delay would result in a local clock (e.g., clock CKA) being matched to an input clock (e.g., clock IN) in every possible way. Thus, delays C2–C5 would be removed from the FIG. 1 clocks, and periods A5 and B5 of clock LOCAL_4 would be adjusted to match periods A1 and B1 of clock IN. Unfortunately, the removal of insertion delays can be difficult, especially when an IC is subject to process variations, variable operating conditions, and so on. If an IC's input clock is a differential clock, and the IC's local clocks are single-ended clocks, then the removal of insertion delay is further complicated. Changes in internal and external voltage swing, edge rate and other factors may also complicate matters.

Insertion delay is typically removed from an IC's local clocks via a delay-locked loop (DLL). A DLL is a device which uses a "delay comparator and correction unit" to phase-align first and second clocks. The first clock is derived from the IC's input clock (e.g., an external clock), and the second clock is derived from a feedback clock. In response to these clocks, the delay comparator and correction unit generates a delay-corrected clock and the afore-mentioned feedback clock. The delay-corrected clock is then distributed to an IC's register elements via a clock distribution network, and the feedback clock is routed back into the delay comparator and correction unit via a feedback circuit. If the feedback circuit is constructed such that its delay equals the sum of 1) the delay incurred in routing a clock signal through the clock distribution circuit, 2) the delay incurred in receiving, buffering and inputting the input clock into the delay comparator and correction unit, and 3) the delay through the delay comparator and correction unit, then the delays associated with local clocks received at the IC's register elements will substantially match the delays associated with the input clock.

Figure 2:
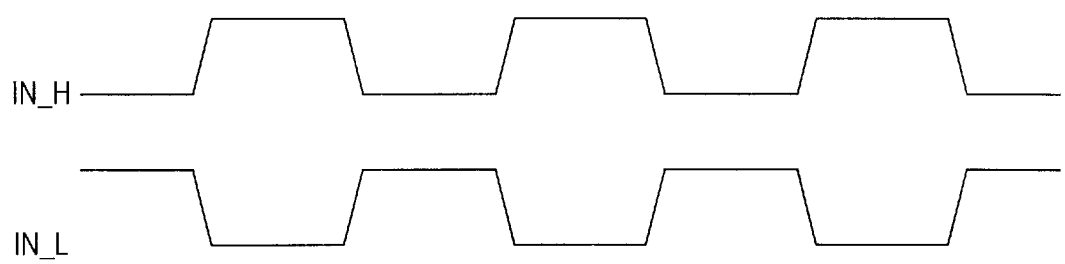
FIG. 2 illustrates a differential input clock comprising components IN_H and IN_L.

When an IC receives a differential input clock such as that which is shown in FIG. 2 (IN_H, IN_L), insertion delay is typically removed from the IC's local clocks by placing a string of invertors in a DLL's feedback path. The number and size of the invertors is chosen such that the delay through the string of invertors is substantially matched to the delay through the differential receiver which receives the differential input clock. Unfortunately, however, the delay through a string of invertors is not a very good match to the delay through a differential receiver (especially when the differential receiver and string of invertors are subjected to process variations, variable operating conditions, and so on).

Figure 3A:
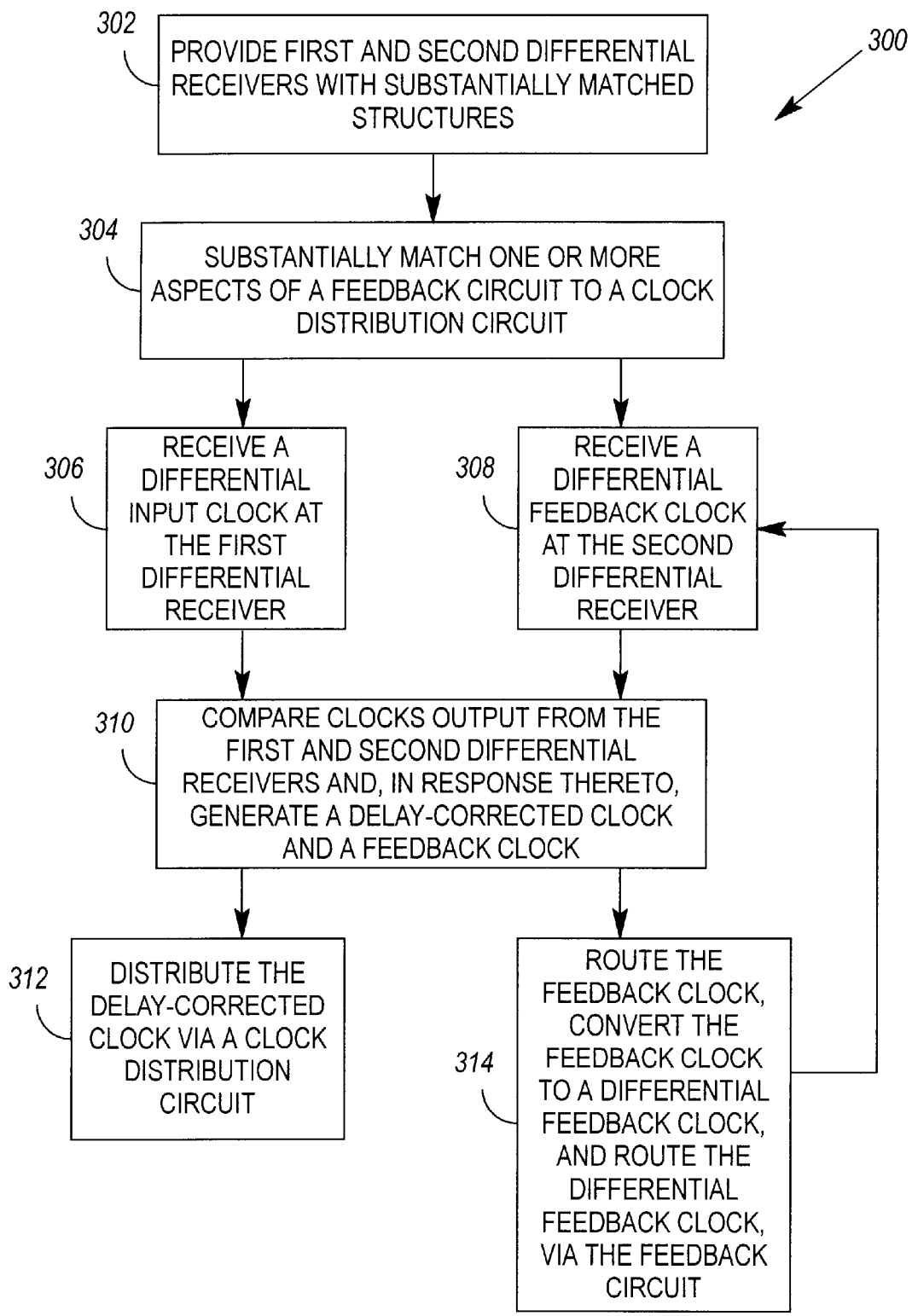
FIGS. 3A & 3B illustrate methods for distributing clocks.
Figure 3B:
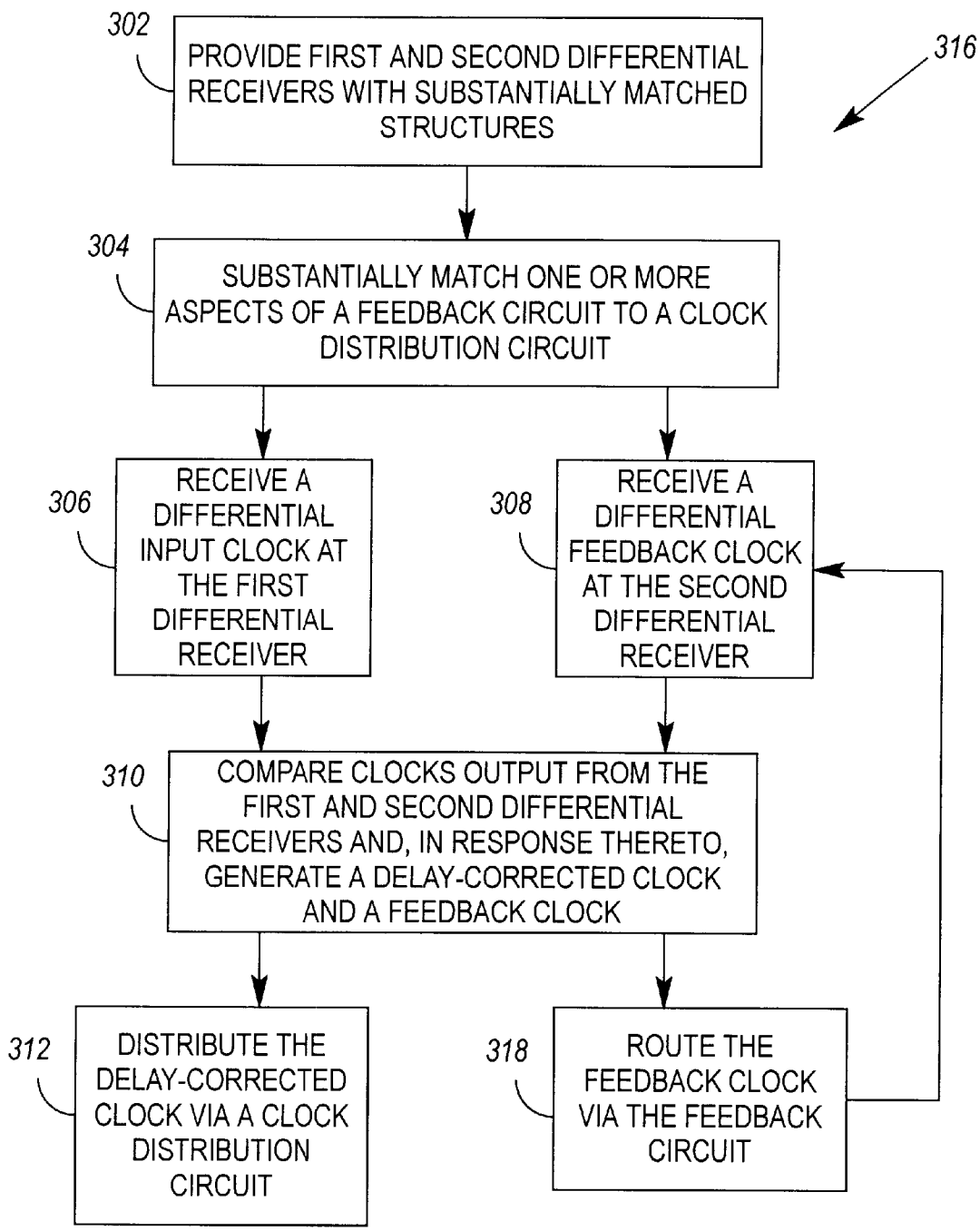

FIGS. 3A & 3B therefore illustrate new methods for distributing clocks. The method 300 disclosed in FIG. 3A may be used in conjunction with an IC 400 (FIG. 4) which distributes single-ended internal clocks, and the method 316 disclosed in FIG. 3B may be used in conjunction with an IC 800 (FIG. 8) which distributes differential internal clocks.

The method 300 illustrated in FIG. 3A provides an IC or other circuit with first and second differential receivers having substantially matched structures 302. In this manner, the delay and other aspects of the first and second receivers should also be substantially matched. A differential input clock is received at the first differential receiver 306, and a differential feedback clock is received at the second differential receiver 308. First and second clocks output from the two differential receivers are then compared, and in response thereto, a delay-corrected clock and a feedback clock are generated 310. The feedback clock is then converted into the afore-mentioned differential feedback clock and provided to the second differential receiver 314. In this manner, insertion delays associated with the first differential receiver and the delay comparison and correction unit are removed from the delay-corrected clock.

If the delay-corrected clock is distributed via a clock distribution circuit (e.g., internally to an IC), then one or more aspects of a feedback circuit through which the feedback and differential feedback clocks are routed (and through which the feedback clock is converted into the differential feedback clock) are substantially matched to one or more aspects of the clock distribution circuit. In this manner, insertion delay associated with the clock distribution circuit may also be removed from the delay-corrected clock.

The method 316 illustrated in FIG. 3B is similar to that which is shown in FIG. 3A. However, in FIG. 3B, the delay-corrected clock and feedback clock are presumed to be differential. As a result, there is no need to convert the feedback clock into differential form. Rather, the differential feedback clock produced as a result of step 310 may simply be routed to the second differential receiver 318. If it is desired to remove insertion delay associated with a clock distribution circuit, then the differential feedback clock may be routed via a feedback circuit having one or more aspects which are substantially matched to one or more aspects of the clock distribution circuit.

Figure 4:
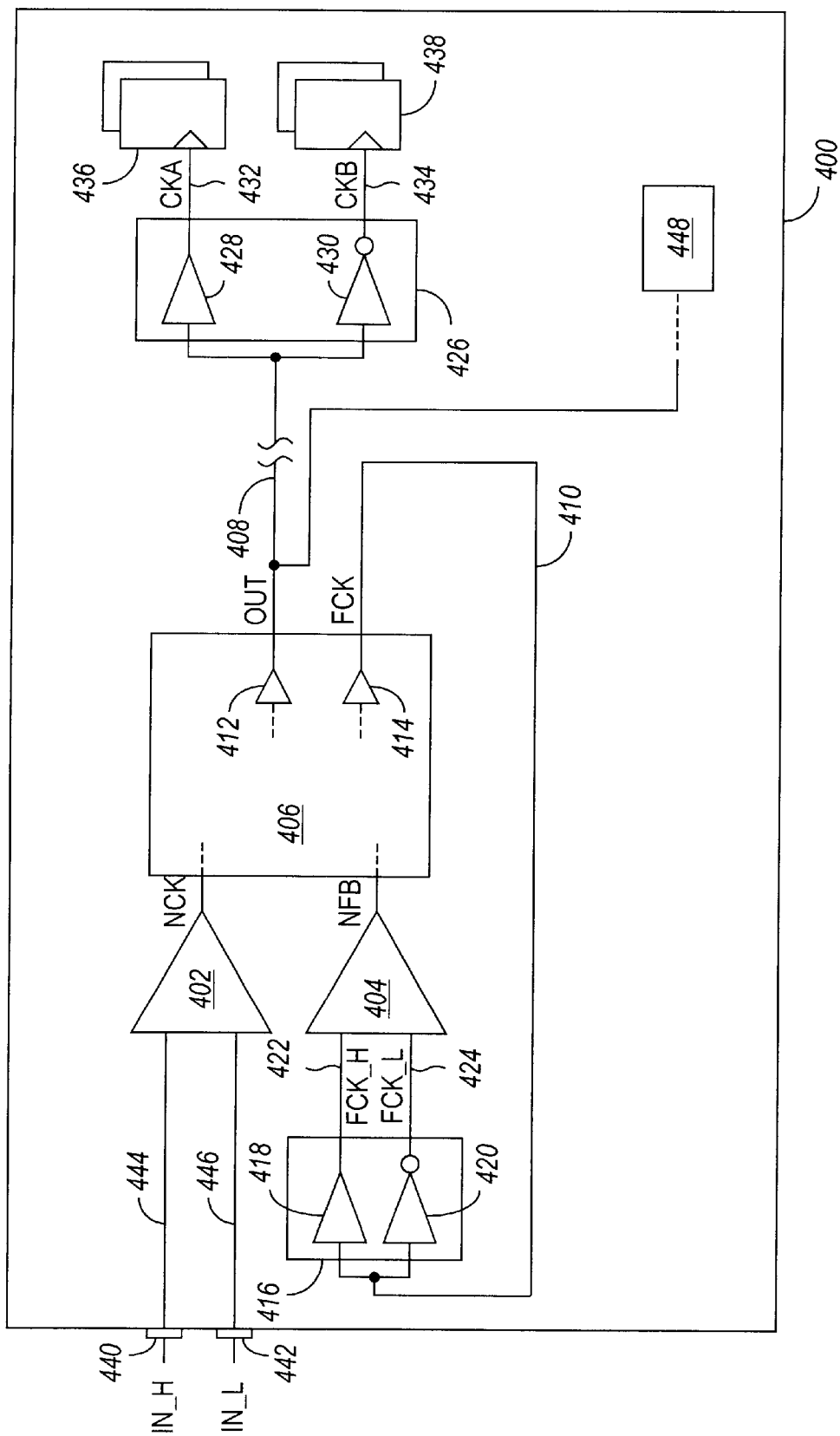
FIG. 4 illustrates an IC 400 comprising a first preferred embodiment of apparatus for distributing clocks.

FIG. 4 illustrates an IC 400 comprising a first preferred embodiment of apparatus for distributing clocks. The apparatus comprises first and second differential receivers 402, 404, a delay comparator and correction unit 406 (e.g., a DLL), and a feedback circuit 410, 416, 422, 424. The structures of the first and second differential receivers 402, 404 are substantially matched. "Substantially matched" means that the structures of each differential receiver 402, 404 are substantially the same. Preferably, the structures of each differential receiver 402, 404 are exactly matched. However, due to changes in voltage swings internally and externally to the IC, changes in edge rates internally and externally to the IC, and/or other factors, the two differential receivers 402, 404 might comprise, for example, different size transistors.

The first differential receiver 402 receives a differential input clock (IN_H, IN_L) and outputs a first clock (NCK). The second differential receiver 404 receives a differential feedback clock (FCK_H, FCK_L) and outputs a second clock (NFB). The first and second clocks (NCK, NFB) are received by the delay comparator and correction unit 406. In response thereto, the delay comparator and correction unit 406 generates a delay-corrected clock (OUT) and a feedback clock (FCK). To reduce the complexity of the differential receivers 402, 404 and delay comparator and correction unit 406, and to reduce the number of signal routes which are needed to distribute clocks within an IC 400, the first and second clocks (NCK, NFB), as well as the delay-corrected clock (OUT) and feedback clock (FCK), are preferably single-ended clocks.

The feedback circuit 410, 416, 422, 424 comprises 1) a first signal route 410 for carrying the feedback clock (FCK) from the delay comparator and correction unit 406, 2) a converter 416 for converting the feedback clock (FCK) into the afore-mentioned differential feedback clock (FCK_H, FCK_L), and 3) a second signal route 422, 424 for coupling the converter 416 to the second differential receiver 404. The converter 416 may be implemented in various ways, but preferably comprises parallel inverting and non-inverting buffers 418, 420 having well-matched delays. Delays through the buffers 418, 420 should be well-matched so that the differential feedback clock (FCK_H, FCK_L) comprises two signals which are complements of one another.

In FIG. 4, the delay-corrected clock (OUT) and feedback clock (FCK) are shown to be generated by different output buffers 412, 414 of the delay comparator and correction unit 406. However, the two clocks may be generated in alternate ways. For example, in FIG. 5, an IC 500 is shown to comprise a delay comparator and correction unit 502 comprising only a single output buffer 504. However, the single output buffer 504 drives two different output lines 408, 410, one of which carries a delay-corrected clock (OUT), and one of which carries a feedback clock (FCK).

The delay through the feedback circuit may be variously adjusted, depending on which insertion delays need to be accounted for in the delay-corrected clock (OUT). In one embodiment of the FIG. 4 apparatus, the insertion delays which are accounted for in the delay-corrected clock (OUT) comprise the delay through the first differential receiver 402, and the delay through the delay comparison and correction unit 406. In this embodiment, the structure of the second differential receiver 404 is substantially matched to that of the first differential receiver 402, and the delay through the feedback circuit 410, 416, 422, 424 is minimized. As a result, the delays which are associated with the delay-corrected clock (OUT) are substantially matched to those which are associated with the differential input clock (IN_H, IN_L).

In other embodiments of the FIG. 4 apparatus, the insertion delays which are accounted for in the delay-corrected clock (OUT) comprise the delay through the first differential receiver 402, the delay through the delay comparison and correction unit 406, and the delay through one or more portions of a clock distribution circuit 408, 426, 432, 434. In these embodiments, the structure of the second differential receiver 404 is substantially matched to that of the first differential receiver 402, and one or more aspects of the feedback circuit 410, 416, 422, 424 are substantially matched to one or more aspects of the clock distribution circuit 408, 426, 432, 434. One aspect which can be substantially matched is delay. However, at least some of the substantially matching aspects are preferably tied to structure. Thus, not only are delays substantially matched but, when possible, structures are also substantially matched. For example, the clock distribution circuit 408, 426, 432, 434 shown in FIG. 4 comprises a global clock distribution circuit 408, a local clock buffer 426, and a local clock distribution circuit 432, 434. Together, these elements serve to route the delay-corrected clock (OUT) to a plurality of register elements 436, 438 (e.g., latches or flip-flops). The functions of the global clock distribution circuit 408, local clock buffer 426, and local clock distribution circuit 432, 434 may vary from IC to IC. However, in FIG. 4, the global clock distribution circuit 408 is preferably used to route the delay-corrected clock (OUT) to one or more local clock buffers 426, 448 of an IC 400; the local clock buffer 426 is preferably used to amplify the delay-corrected clock (OUT), clean up its edges, and create inverting and non-inverting clocks (e.g., CKA and CKB); and the local clock distribution circuit 432, 434 is preferably used to route the inverting and non-inverting clocks from the local clock buffer 426 to the plurality of register elements 436, 438. The local clock buffer may comprise, for example, inverting and non-inverting buffers 428, 430 for performing some or all of its functions.

With respect to a clock distribution circuit 408, 426, 432, 434 such as that which is shown in FIG. 4, one or more aspects of the converter 416 in the feedback circuit 410, 416, 422, 424 may be substantially matched to one or more aspects of the local clock buffer 426 in the clock distribution circuit 408, 426, 432, 434 (e.g., inverters 418 and 420 may be matched to inverters 428 and 430). Similarly, one or more aspects of the first signal route 410 of the feedback circuit 410, 416, 422, 424 may be substantially matched to one or more aspects of the afore-mentioned global clock distribution circuit 408. Likewise, one or more aspects of the second signal route 422, 424 of the feedback circuit 410, 416, 422, 424 (i.e., a differential signal route) may be substantially matched to one or more aspects of the afore-mentioned local clock distribution circuit 432, 434.

Preferably, the delay which is imparted to a differential input clock (IN_H, IN_L) as it is routed from an IC's external contacts 440, 442 to a differential receiver 402 is minimized by minimizing the length of the differential signal route 444, 446 extending between the contacts 440, 442 and the receiver 402.

Figure 5:
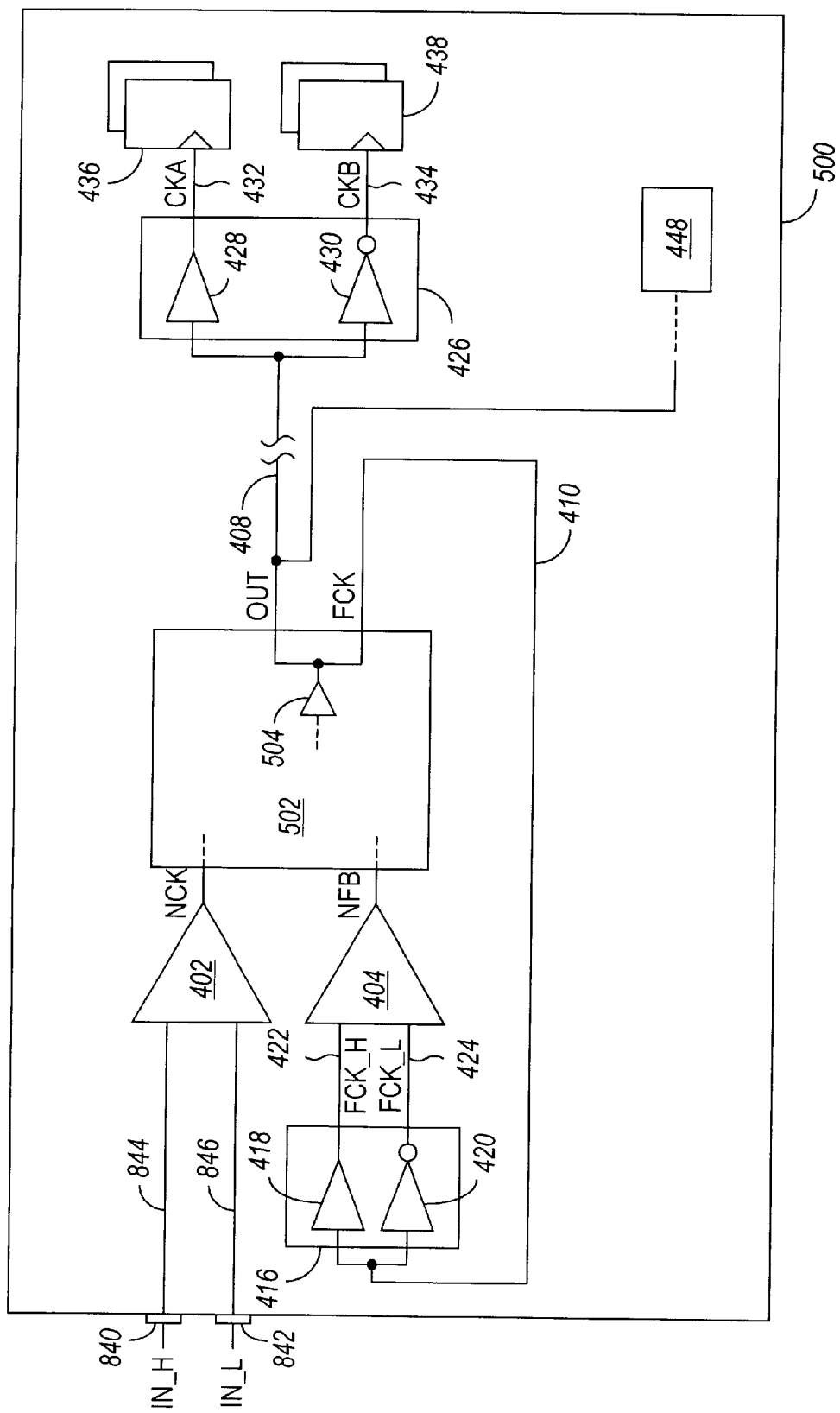
FIG. 5 illustrates an IC 500 comprising an alternate embodiment of the delay comparison and correction unit shown in FIG. 4.
Figure 6:
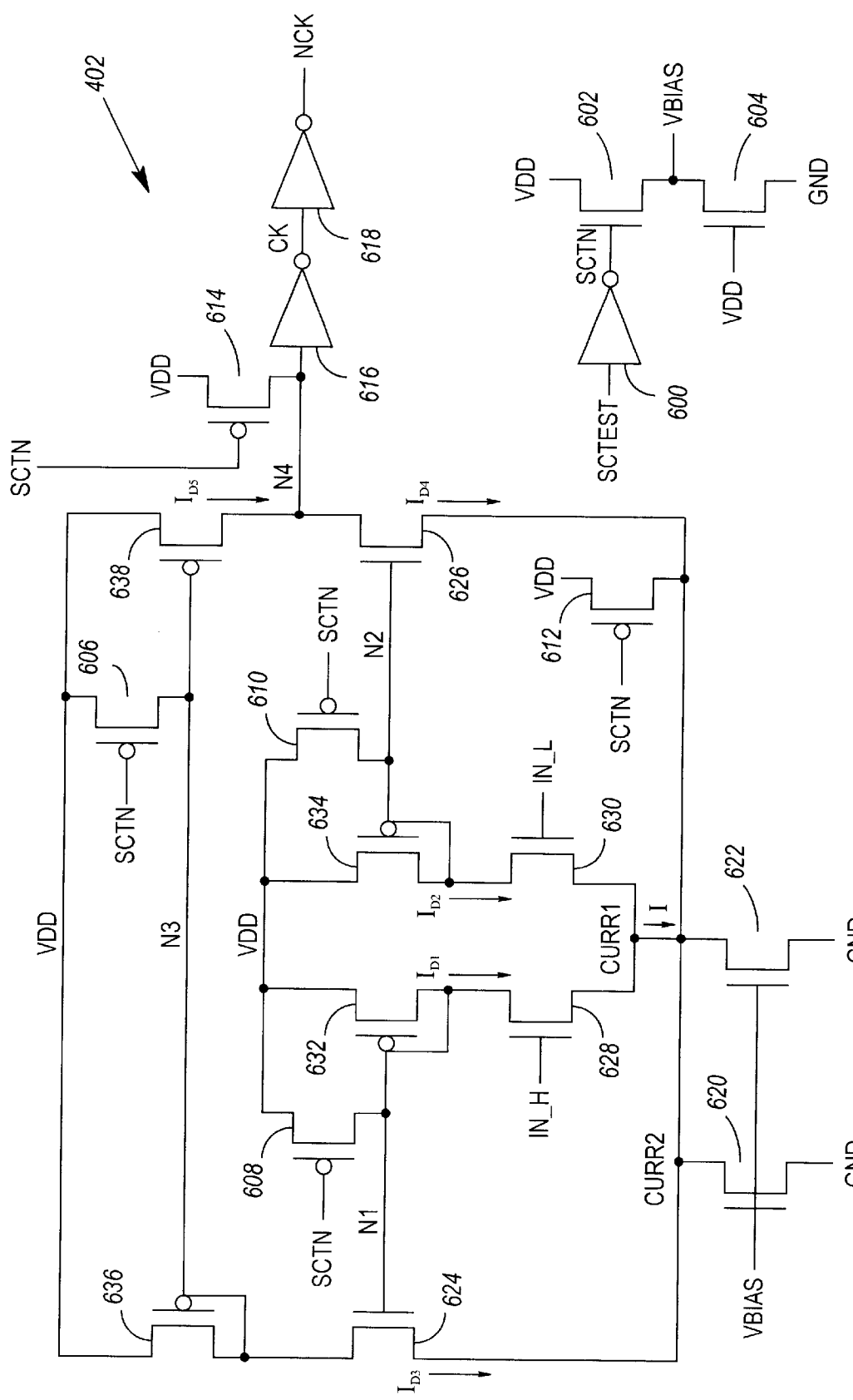
FIG. 6 illustrates a preferred embodiment of a first differential receiver shown in FIG. 4.
Figure 7:
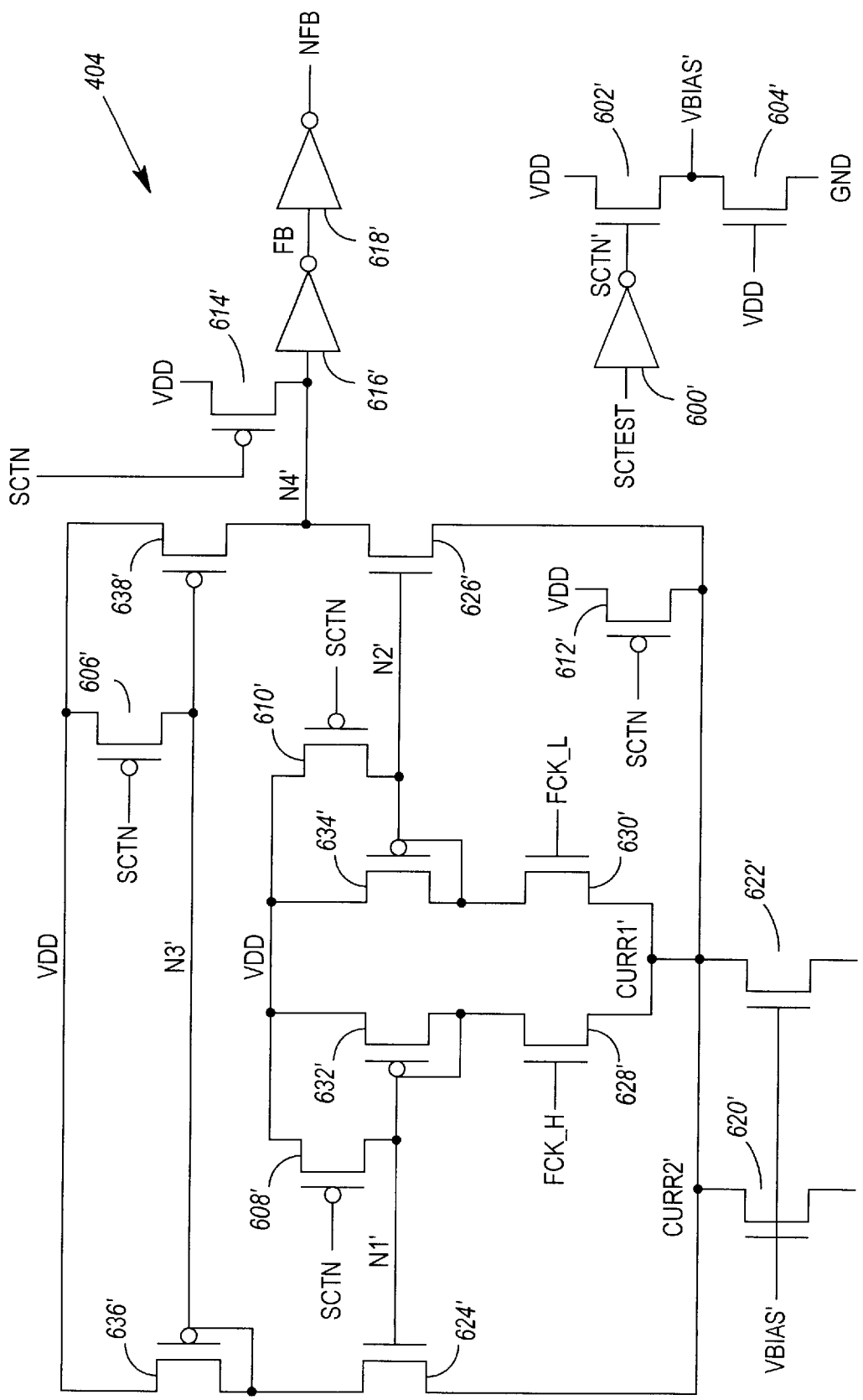
FIG. 7 illustrates a preferred embodiment of a second differential receiver shown in FIG. 4.

FIGS. 6 & 7 respectively illustrate preferred embodiments of the first and second differential receivers 402, 404 shown in FIGS. 4 & 5. Preferably, each differential receiver 402, 404 comprises at least one metal-oxide semiconductor (MOS) differential pair 628, 630 for receiving the differential receiver's differential clock. In FIGS. 6 & 7, each differential receiver 402, 404 comprises plural cascaded MOS differential pairs 628/630, 624/626, with one MOS differential pair 628, 630 in each differential receiver 402, 404 receiving the differential receiver's differential clock.

FIG. 6 illustrates a preferred embodiment of the first receiver 402 shown in FIG. 4. The receiver 402, by way of example, is implemented in complementary MOS (CMOS) logic. However, the receiver 402 could also be implemented in PMOS logic, NMOS logic, or other logic.

The receiver 402 comprises a constant current source 620, 622; first and second MOS differential pairs 628/630, 624/626; a number of current mirrors 632/624, 634/626, 636/638; and an output stage 616, 618.

A first of the MOS differential pairs 628/630 is configured to receive a differential input clock. The differential input clock comprises a high component, IN_H, and a low component, IN_L. The high component of the input clock is received at the gate of a first n-channel, field-effect-transistor (NFET 628), and the low component of the input clock is received at the gate of a second NFET 630. The source of the first NFET 628 is coupled to drive a first of the receiver's current mirrors 632/624, while the source of the second NFET 630 is coupled to drive a second of the receiver's current mirrors 634/626. The drain of each NFET 628, 630 is coupled to the node CURR1. The NFETs are substantially matched in size and configuration.

Also coupled to the node CURR1 is the constant current source 620, 622. The constant current source comprises a pair of NFETs 620, 622 which are coupled in parallel, via their sources and drains, between the node CURR1 and ground (GND). The gate of each NFET 620, 622 is driven by the signal VBIAS.

The VBIAS signal is derived from the signal SCTEST. SCTEST is a control signal which can be used to turn off the static current flow in the receiver 402 during silicon test. During normal operation of the receiver 402, SCTEST is held low. SCTEST is fed to an inverter 600 to produce the signal SCTN. SCTN is then applied to the gate of an NFET 602 which is coupled between a high potential (VDD) and VBIAS via its source and drain. A second NFET 604 is coupled between VBIAS and ground (GND) via its source and drain. The gate of the second NFET 604 is tied high. Thus, when SCTEST is held low, there is a drive fight between the two NFETs 602, 604. However, the NFET 602 which receives SCTN is sized larger than the second NFET 604 so that it easily wins the drive fight and pulls VBIAS high while SCTEST is low. During test, however, SCTEST may be driven high so that the NFET 602 which receives SCTN ceases to conduct. The second NFET 604 is therefore allowed to pull VBIAS low. This, in turn, disables the receiver's constant current source 620/622. Note that the signal SCTN is also applied to the gates of several pull-up p-channel FETs (PFETs 606–614). Thus, during test, the pull-up FETs 606–614 conduct to pull various of the receiver's nodes to a high potential. During the receiver's normal operation, the pull-up FETs 606–614 have no effect on the receiver 402.

Each of the current mirrors 632/624, 634/626 which is driven by the first MOS differential pair 628/630 comprises a PFET 632, 634 and an NFET 624, 626, with the PFET 632, 634 and NFET 624, 626 of each current mirror 632/624, 634/626 being coupled gate-to-gate (at nodes N1 and N2, respectively). The source of each PFET 632, 634 is coupled to a high potential (VDD). The drain of each PFET 632, 634 is coupled to its gate, as well as a respective one of the NFETs 628, 630 of the first MOS differential pair. Thus, each of the PFETs 632, 634 is configured as a diode-connected FET.

A second MOS differential pair 624/626 is formed from the NFETs 624, 626 of the afore-mentioned current mirrors 632/624, 634/626. The drain of each NFET 624, 626 in the second MOS pair 624/626 is coupled to the node CURR2. The NFETs are substantially matched in size and configuration. The nodes CURR2 and CURR1 form a supernode such that the drains of the second MOS differential pair 624/626 are also coupled to the constant current source 620, 622. The sources of the NFETs 624, 626 in the second MOS pair are respectively coupled to the input and output of a third current mirror 636/638. The third current mirror comprises two FETs 636, 638 which are coupled gate-to-gate. The first FET is a PFET 636. The PFET 636 is coupled via its source and drain between a high potential (VDD) and a first NFET 624 of the second MOS pair 624/626. The drain and gate of the PFET 636 are coupled so that the PFET 636 is configured as a diode-connected FET. The second FET of the current mirror is an NFET 638. The NFET 638 is coupled via its source and drain between a high potential (VDD) and a second NFET 626 of the second MOS pair 624/626.

One of ordinary skill in the art will realize that the FIG. 4 receiver 402 comprises three stages. The first stage 1) comprises the first MOS differential pair 628/630, 2) has a high input resistance, and 3) provides high immunity to different edge rates and common mode voltages. The second stage 1) comprises the second MOS differential pair 624/626, 2) converts the differential input clock to a single-ended clock, and 3) provides significant voltage gain. The third stage of the receiver 402 is an output stage comprising a string of invertors 616, 618.

In operation, the receiver 402 is activated by first driving VBIAS to a high potential. At this point, both NFETs 620, 622 of the constant current source begin to conduct, and a current, I, begins to flow between the supernode CURR1/CURR2 and ground. With both components (IN_H, IN_L) of the differential input clock resting at a zero potential, drain currents, $I_{D1}$, $I_{D2}$, $I_{D3}$ and $I_{D4}$ flow, respectively, from the first and second MOS differential pair NFETs 628, 630, 624, 626. As a result of the current mirrors 632/624, 634/626 driven by the first MOS differential pair 628/630 (i.e., the MOS pair receiving the differential input clock), the currents $I_{D1}$ and $I_{D2}$ are respectively copied to the drains of the NFETs 624, 626 of the second MOS differential pair 624/626 (i.e., as currents $I_{D3}$ and $I_{D4}$, respectively). Then, as a result of the current mirror 636/638 which is coupled between the NFETs 624, 626 of the second MOS differential pair 624/626, the drain current $I_{D3}$ is copied to the drain of the rightmost NFET 638 of the current mirror 636/638. Thus, currents $I_{D1}$, $I_{D2}$, $I_{D3}$, $I_{D4}$ and $I_{D5}$ are substantially equal. This being the case, no current flows to the receiver's output stage 616, 618, and clock output NCK is held low.

With the transmission of a first pulse of the differential input clock, input IN_H rises high, and input IN_L remains low. This, in turn, lowers the resistance of the NFET 628 coupled between nodes N1 and CURR1, thereby causing current $I_{D1}$ to increase and pull a greater share of the constant current, I. Current $I_{D2}$ therefore decreases. Since current $I_{D1}$ is copied to currents $I_{D3}$ and $I_{D5}$, current $I_{D4}$ also decreases. Current $I_{D5}$ therefore exceeds current $I_{D4}$ and, as a result, the rightmost PFET 638 of the third current mirror 636/638 pulls output node N4 to a high potential. This causes node CK to fall, and causes node NCK to rise.

Thereafter, input IN_H falls low, and input IN_L rises high. The state of the receiver 402 therefore changes accordingly as 1) the resistance of the NFET 630 coupled between nodes N2 and CURR1 decreases, 2) the resistance of the NFET 628 coupled between nodes N1 and CURR1 increases, 3) currents $I_{D1}$, $I_{D3}$ and $I_{D5}$ decrease, and 4) currents $I_{D2}$ and $I_{D4}$ increase. Current $I_{D4}$ therefore exceeds current $I_{D5}$ and, as a result, the rightmost NFET 626 of the second MOS pair 624/626 pulls output node N4 to a low potential. This causes node CK to rise, and causes node NCK to fall. The cycle set forth in the above paragraphs is then repeated as additional clock pulses are received.

FIG. 7 illustrates a preferred embodiment of the second receiver 404 shown in FIG. 4. The receiver 404 is substantially (and preferably exactly) matched to the receiver 402 shown in FIG. 6. Structures in FIG. 7 which match the structures in FIG. 6 are referenced with primed versions of the reference numbers and node names used in FIG. 6. The structures referenced by reference numbers 600–638 and node names CURR1, CURR2, N1, N2, N3, N4, SCTN and VBIAS are therefore matched to the structures referenced by reference numbers 600'–638' and node names CURR1', CURR2', N1', N2', N3', N4', SCTN' and VBIAS'. The receiver 404 illustrated in FIG. 7 differs from that which is illustrated in FIG. 6 in that the FIG. 7 input NFETs 628', 630' respectively receive components of a differential feedback clock (FCK_H, FCK_L), and the receiver's output inverters 616', 618' respectively produce clocks FB and NFB. In all other respects, the two receivers 402, 404 operate in the same manner.

In some embodiments of the FIG. 4 IC 400, the differential input clock and feedback clock might have the same voltage swing (e.g., 2.5V). In these embodiments, the delays through the receivers 402, 404 illustrated in FIGS. 6 & 7 should be exact. However, in other embodiments of the FIG. 4 IC 400, the differential input clock and feedback clock might have differing voltage swings. For example, the voltage swing of the input clock might be 2.5V, whereas the voltage swing of the feedback clock might be 1.5V. In these latter embodiments, it is preferable that the first and second differential receivers 402, 404 have a high immunity to different clock edge rates and common mode voltages. Such immunity is largely achieved by the receivers 402, 404 illustrated in FIGS. 6 & 7.

Figure 8:
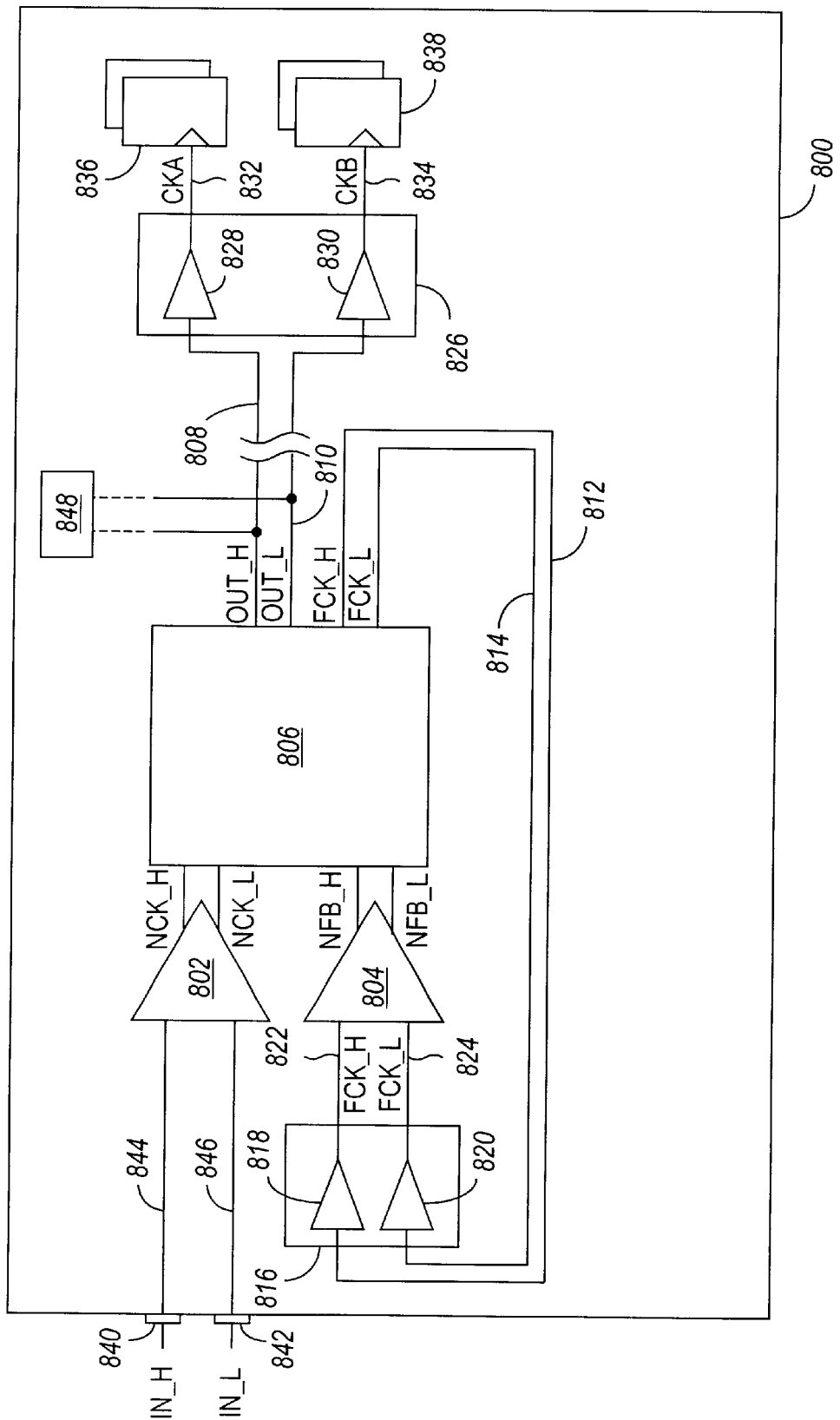
FIG. 8 illustrates an IC 800 comprising a second preferred embodiment of apparatus for distributing clocks.

FIG. 8 illustrates an IC 800 comprising a second preferred embodiment of apparatus for distributing clocks. Whereas the IC 400 shown in FIG. 4 routes many internal clocks as single-ended clocks (e.g., NCK, NFB, OUT, FCK), the IC 800 shown in FIG. 8 routes many internal clocks as differential clocks. As in FIG. 4, the FIG. 8 apparatus comprises first and second differential receivers 802, 804, a delay comparator and correction unit 806, and a feedback circuit 812, 814, 816, 822, 824. The structures of the first and second differential receivers 802, 804 are substantially matched, and are preferably exactly matched.

The first differential receiver 802 receives a differential input clock (IN_H, IN_L) and outputs a first clock (NCK_H, NCK_L). The second differential receiver 804 receives a differential feedback clock (FCK_H, FCK_L) and outputs a second clock (NFB_H, NFB_L). Although the first and second clocks are shown to be differential clocks, they could also be single-ended clocks. The first and second clocks are received by the delay comparator and correction unit 806. In response thereto, the delay comparator and correction unit 806 generates a differential delay-corrected clock (OUT_H, OUT_L) and a differential feedback clock (FCK_H, FCK_L).

Although the feedback circuit could consist of a simple differential wire route between the delay comparator and correction unit 806 and the second differential receiver 804, the feedback circuit 812, 814, 816, 822, 824 preferably comprises 1) a first signal route 812, 814 for carrying the differential feedback clock (FCK_H, FCK_L) from the delay comparator and correction unit 806, 2) a feedback clock buffer 816, and 3) a second signal route 822, 824 for coupling the feedback clock buffer 816 to the second differential receiver 804. The feedback clock buffer 816 may be implemented in various ways, but preferably comprises parallel non-inverting buffers 818, 820 having well-matched delays. Delays through the buffers 818, 820 should be well-matched so that the differential feedback clock (FCK_H, FCK_L) maintains two signals which are complements of one another.

As in FIG. 4, the delay through the feedback circuit may be variously adjusted, depending on which insertion delays need to be accounted for in the differential delay-corrected clock (OUT_H, OUT_L). In one embodiment of the FIG. 8 apparatus, the insertion delays which are accounted for in the differential delay-corrected clock (OUT) comprise the delay through the first differential receiver 802, and the delay through the delay comparison and correction unit 806. In this embodiment, the structure of the second differential receiver 804 is substantially matched to that of the first differential receiver 802, and the delay through the feedback circuit 812, 814, 816, 822, 824 is minimized. As a result, the delays which are associated with the differential delay-corrected clock (OUT_H, OUT_L) are substantially matched to those which are associated with the differential input clock (IN_H, IN_L).

In other embodiments of the FIG. 8 apparatus, the insertion delays which are accounted for in the differential delay-corrected clock (OUT_H, OUT_L) comprise the delay through the first differential receiver 802, the delay through the delay comparison and correction unit 806, and the delay through one or more portions of a clock distribution circuit 808, 810, 826, 832, 834. In these embodiments, the structure of the second differential receiver 804 is substantially matched to that of the first differential receiver 802, and one or more aspects of the feedback circuit 812, 814, 816, 822, 824 are substantially matched to one or more aspects of the clock distribution circuit 808, 810, 826, 832, 834. One aspect which can be substantially matched is delay. However, at least some of the substantially matching aspects are preferably tied to structure. Thus, not only are delays substantially matched but, when possible, structures are also substantially matched. For example, the clock distribution circuit 808, 810, 826, 832, 834 shown in FIG. 8 comprises a global clock distribution circuit 808, 810, a local clock buffer 826, and a local clock distribution circuit 832, 834. Together, these elements serve to route the differential delay-corrected clock (OUT) to a plurality of register elements 836, 838. The functions of the global clock distribution circuit 808, 810, local clock buffer 826, and local clock distribution circuit 832, 834 may vary from IC to IC. However, in FIG. 8, the global clock distribution circuit 808, 810 is preferably used to route the differential delay-corrected clock (OUT_H, OUT_L) to one or more local clock buffers 826, 848 of an IC 800; the local clock buffer 826 is preferably used to amplify the differential delay-corrected clock (OUT_H, OUT_L), clean up its edges, and create inverting and non-inverting local clocks (e.g., CKA and CKB); and the local clock distribution circuit 832, 834 is preferably used to route the inverting and non-inverting local clocks from the local clock buffer 826 to the plurality of register elements 836, 838. The local clock buffer may comprise, for example, a pair of non-inverting buffers 828, 830 for performing some or all of its functions.

With respect to a clock distribution circuit 808, 810, 826, 832, 834 such as that which is shown in FIG. 8, one or more aspects of the feedback clock buffer 816 in the feedback circuit 812, 814, 816, 822, 824 may be substantially matched to one or more aspects of the local clock buffer 826 in the clock distribution circuit 808, 810, 826, 832, 834. Similarly, one or more aspects of the first signal route 812, 814 of the feedback circuit 812, 814, 816, 822, 824 may be substantially matched to one or more aspects of the afore-mentioned global clock distribution circuit 808, 810. Likewise, one or more aspects of the second signal route 822, 824 of the feedback circuit 812, 814, 816, 822, 824 may be substantially matched to one or more aspects of the afore-mentioned local clock distribution circuit 832, 834.

Preferably, the delay which is imparted to a differential input clock (IN_H, IN_L) as it is routed from an IC's external contacts 840, 842 to a differential receiver 802 is minimized by minimizing the length of the differential signal route 844, 846 extending between the contacts 840, 842 and the receiver 802.

Each differential receiver 802, 804 may comprise at least one MOS differential pair for receiving the differential receiver's differential clock. Preferably, the differential receivers 802, 804 comprise plural cascaded MOS differential pairs, with one MOS differential pair in each differential receiver 802, 804 receiving the differential receiver's differential clock. Each differential receiver 802, 804 is preferably implemented in CMOS logic, but may also be implemented in PMOS logic or NMOS logic, and may be implemented dynamically or statically.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. Apparatus for distributing clocks, comprising:
   a. first and second differential receivers, the structures of said first and second differential receivers being substantially matched, said first differential receiver receiving a differential input clock and outputting a first clock, and said second differential receiver receiving a differential feedback clock and outputting a second clock;
   b. a delay comparator and correction unit, said delay comparator and correction unit receiving said first and second clocks and generating, in response thereto, a delay-corrected clock and a feedback clock; and
   c. a feedback circuit, said feedback circuit comprising a first signal route for carrying said feedback clock from said delay comparator and correction unit, a converter for converting said feedback clock to said differential feedback clock, and a second signal route for coupling said converter to said second differential receiver.

2. Apparatus for distributing clocks as in claim 1, wherein each of said first and second differential receivers comprises at least one MOS differential pair for receiving said differential receiver's differential clock.

3. Apparatus for distributing clocks as in claim 1, wherein each of said first and second differential receivers comprises plural cascaded MOS differential pairs, and wherein one MOS differential pair in each differential receiver receives said differential receiver's differential clock.

4. Apparatus for distributing clocks as in claim 1, wherein the structures of said first and second differential receivers are exactly matched.

5. Apparatus for distributing clocks as in claim 1, wherein said first and second differential receivers are CMOS logic receivers.

6. Apparatus for distributing clocks as in claim 1, wherein said converter in said feedback circuit comprises parallel inverting and non-inverting buffers, said parallel buffers having well-matched delays.

7. Apparatus for distributing clocks as in claim 1, wherein said delay-corrected clock and said feedback clock are single-ended clocks.

8. Apparatus for distributing clocks as in claim 1, further comprising a clock distribution circuit, said clock distribution circuit routing said delay-corrected clock to at least one register element; wherein one or more aspects of said feedback circuit are substantially matched to one or more aspects of said clock distribution circuit.

9. Apparatus for distributing clocks as in claim 8, wherein:
   a. said clock distribution circuit comprises a local clock buffer and a global clock distribution circuit, said global clock distribution circuit routing said delay-corrected clock to said local clock buffer; and
   b. one or more aspects of said converter in said feedback circuit are substantially matched to one or more aspects of said local clock buffer.

10. Apparatus for distributing clocks as in claim 9, wherein one or more aspects of said first signal route of said feedback circuit are substantially matched to one or more aspects of said global clock distribution circuit.

11. Apparatus for distributing clocks as in claim 10, wherein:
   a. said clock distribution circuit further comprises a local clock distribution circuit, said local clock distribution circuit routing at least one clock between said local clock buffer and said at least one register element; and
   b. one or more aspects of said second signal route of said feedback circuit are substantially matched to one or more aspects of said local clock distribution circuit.

12. Apparatus for distributing clocks, comprising:
   a. first and second differential receivers, the structures of said first and second differential receivers being substantially matched, said first differential receiver receiving a differential input clock and outputting a first clock, and said second differential receiver receiving a differential feedback clock and outputting a second clock;
   b. a delay comparator and correction unit, said delay comparator and correction unit receiving said first and second clocks and generating, in response thereto, a differential delay-corrected clock and a differential feedback clock; and
   c. a feedback circuit, said feedback circuit carrying said differential feedback clock from said delay comparator and correction unit to said second differential receiver.

13. Apparatus for distributing clocks as in claim 12, wherein each of said first and second differential receivers comprises at least one MOS differential pair for receiving said differential receiver's differential clock.

14. Apparatus for distributing clocks as in claim 12, wherein each of said first and second differential receivers comprises plural cascaded MOS differential pairs, and wherein one MOS differential pair in each differential receiver receives said differential receiver's differential clock.

15. Apparatus for distributing clocks as in claim 12, wherein the structures of said first and second differential receivers are exactly matched.

16. Apparatus for distributing clocks as in claim 12, wherein said first and second differential receivers are CMOS logic receivers.

17. Apparatus for distributing clocks as in claim 12, further comprising a clock distribution circuit, said clock distribution circuit routing said differential delay-corrected clock to at least one register element; wherein one or more aspects of said feedback circuit are substantially matched to one or more aspects of said clock distribution circuit.

18. Apparatus for distributing clocks as in claim 17, wherein:
 a. said clock distribution circuit comprises a local clock buffer and a global clock distribution circuit, said global clock distribution circuit routing said delay-corrected clock to said local clock buffer;
 b. said feedback circuit comprises a feedback clock buffer, a first signal route for carrying said differential feedback clock from said delay comparator and correction unit to said feedback clock buffer, and a second signal route for coupling said feedback clock buffer to said second differential receiver; and
 c. one or more aspects of said feedback clock buffer are substantially matched to one or more aspects of said local clock buffer.

19. Apparatus for distributing clocks as in claim 18, wherein one or more aspects of said first signal route of said feedback circuit are substantially matched to one or more aspects of said global clock distribution circuit.

20. Apparatus for distributing clocks as in claim 19, wherein said clock distribution circuit further comprises a local clock distribution circuit, said local clock distribution circuit routing at least one clock between said local clock buffer and said at least one register element; wherein one or more aspects of said second signal route of said feedback circuit are substantially matched to one or more aspects of said local clock distribution circuit.

21. A method for distributing clocks, comprising:
 a. providing first and second differential receivers with substantially matched structures;
 b. receiving a differential input clock at said first differential receiver;
 c. receiving a differential feedback clock at said second differential receiver;
 d. comparing clocks output from said first and second differential receivers and, in response thereto, generating a delay-corrected clock and a feedback clock; and
 e. converting said feedback clock to said differential feedback clock.

22. A method for distributing clocks as in claim 21, further comprising:
 a. distributing said delay-corrected clock via a clock distribution circuit;
 b. substantially matching one or more aspects of a feedback circuit to said clock distribution circuit; and
 c. performing said feedback clock conversion, and routing said feedback and differential feedback clocks, via said feedback circuit.

23. A method for distributing clocks, comprising:
 a. providing first and second differential receivers with substantially matched structures;
 b. receiving a differential input clock at said first differential receiver;
 c. receiving a differential feedback clock at said second differential receiver; and
 d. comparing clocks output from said first and second differential receivers and, in response thereto, generating a differential delay-corrected clock and said differential feedback clock.

24. A method for distributing clocks as in claim 23, further comprising:
 a. distributing said differential delay-corrected clock via a clock distribution circuit;
 b. substantially matching one or more aspects of a feedback circuit to said clock distribution circuit; and
 c. routing said differential feedback clock via said feedback circuit.

\* \* \* \* \*